United States Patent
Kim et al.

(10) Patent No.: US 7,049,173 B2
(45) Date of Patent: May 23, 2006

(54) METHOD FOR FABRICATING SEMICONDUCTOR COMPONENT WITH CHIP ON BOARD LEADFRAME

(75) Inventors: Dalson Ye Seng Kim, Singapore (SG); Jeffrey Toh Tuck Fook, Singapore (SG); Lee Choon Kuan, Singapore (SG)

(73) Assignee: Micron Technology, Inc., Boise, ID (US)

(*) Notice: Subject to any disclaimer, the term of this patent is extended or adjusted under 35 U.S.C. 154(b) by 34 days.

(21) Appl. No.: 10/797,807

(22) Filed: Mar. 10, 2004

(65) Prior Publication Data
US 2005/0023654 A1 Feb. 3, 2005

Related U.S. Application Data

(62) Division of application No. 10/633,434, filed on Aug. 1, 2003, now Pat. No. 6,903,449.

(51) Int. Cl.
*H01L 21/44* (2006.01)
(52) U.S. Cl. .................. 438/107; 438/123; 438/124
(58) Field of Classification Search ............. 257/666, 257/676, 670
See application file for complete search history.

(56) References Cited

U.S. PATENT DOCUMENTS

| | | | |
|---|---|---|---|
| 4,210,926 A | 7/1980 | Hacke | |
| 5,397,921 A | 3/1995 | Karnezos | |
| 5,409,865 A | 4/1995 | Karnezos | |
| 5,420,460 A | 5/1995 | Massingill | |
| 5,581,226 A | 12/1996 | Shah | |
| 5,596,225 A | 1/1997 | Mathew et al. | |
| 5,663,593 A | 9/1997 | Mostafazadeh et al. | |
| 5,684,328 A | 11/1997 | Jin et al. | |
| 5,866,939 A | 2/1999 | Shin et al. | |
| 5,898,220 A | 4/1999 | Ball | |
| 5,969,416 A | 10/1999 | Kim | |
| 5,973,393 A | 10/1999 | Chia et al. | |
| 5,976,912 A | 11/1999 | Fukutomi et al. | |
| 6,028,356 A | 2/2000 | Kimura | |
| 6,064,111 A | 5/2000 | Sota et al. | |
| 6,083,776 A | 7/2000 | Manteghi | |
| 6,114,760 A | 9/2000 | Kim et al. | |
| 6,181,000 B1 | 1/2001 | Ooigawa et al. | |
| 6,187,612 B1 | 2/2001 | Orcutt | |
| 6,228,683 B1 | 5/2001 | Manteghi | |
| 6,310,390 B1* | 10/2001 | Moden ................. 257/668 |

(Continued)

FOREIGN PATENT DOCUMENTS

JP 6-252194 9/1994

*Primary Examiner*—Zandra V. Smith
*Assistant Examiner*—Kiesha Rose
(74) *Attorney, Agent, or Firm*—Stephen A. Gratton

(57) ABSTRACT

A semiconductor component includes a chip on board leadframe, a semiconductor die back bonded and wire bonded to the leadframe, an encapsulant on the die and an area array of terminal contacts on the leadframe. The leadframe includes leadfingers, interconnect bonding sites for wire bonding the die, terminal bonding sites for the terminal contacts, and bus bars which electrically connect selected leadfingers to one another. The interconnect bonding sites are located on the leadframe relative to the bus bars such that shorting to the bus bars by wire interconnects is eliminated. A method for fabricating the component includes the steps of attaching the die to the leadframe, bonding the wire interconnects to the die and to the interconnect bonding sites, forming the encapsulant, and then forming the terminal contacts on the terminal bonding sites.

27 Claims, 6 Drawing Sheets

U.S. PATENT DOCUMENTS

| | | |
|---|---|---|
| 6,337,510 B1 | 1/2002 | Chun-Jen et al. |
| 6,359,221 B1 | 3/2002 | Yamada et al. |
| 6,373,447 B1 | 4/2002 | Rostoker et al. |
| 6,415,977 B1 | 7/2002 | Rumsey |
| 6,451,624 B1 * | 9/2002 | Farnworth et al. .......... 438/106 |
| 6,465,877 B1 | 10/2002 | Farnworth et al. |
| 6,501,165 B1 | 12/2002 | Farnworth et al. |
| 6,506,625 B1 | 1/2003 | Moden |
| 6,507,114 B1 | 1/2003 | Hui |
| 6,521,483 B1 | 2/2003 | Hashimoto |
| 6,552,427 B1 | 4/2003 | Moden |
| 6,589,810 B1 | 7/2003 | Moden |
| 6,638,792 B1 | 10/2003 | Hui et al. |
| 6,903,449 B1 | 6/2005 | Kim et al. |
| 2002/0027280 A1 * | 3/2002 | Corisis et al. .............. 257/692 |
| 2002/0031902 A1 | 3/2002 | Pendse et al. |
| 2002/0068379 A1 | 6/2002 | Cobbley et al. |
| 2002/0195691 A1 | 12/2002 | Schoenfeld |

* cited by examiner

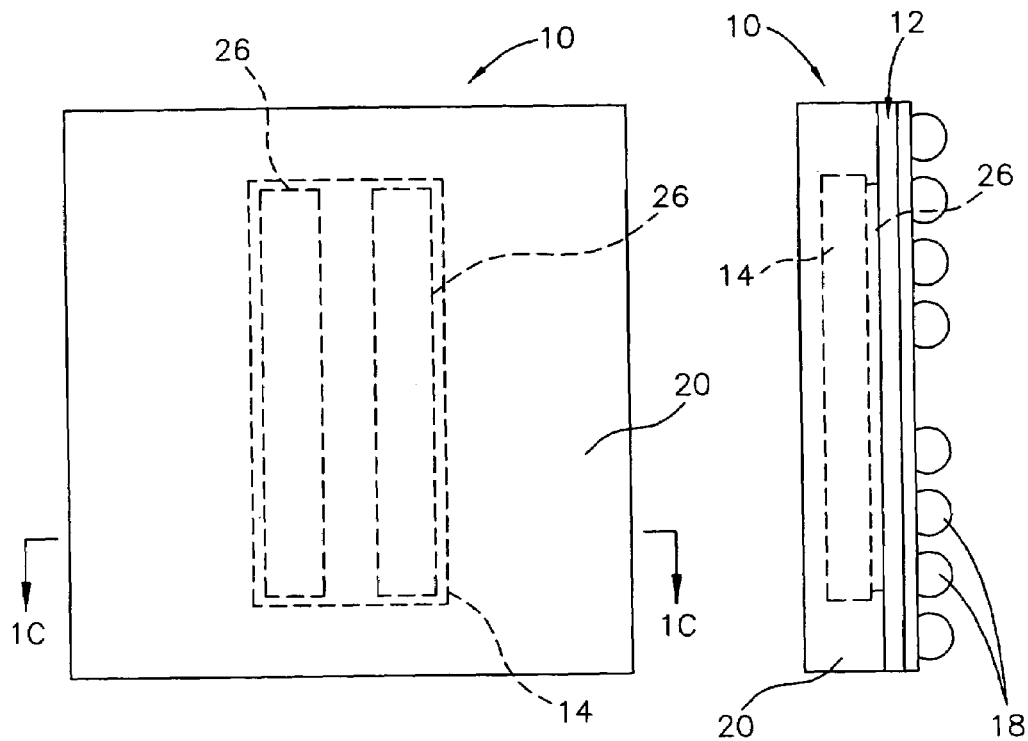
FIGURE 1A
FIGURE 1B
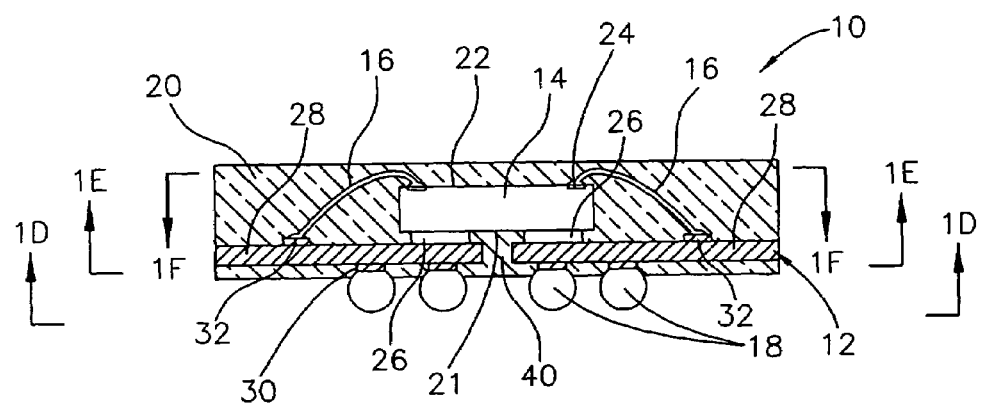
FIGURE 1C

US 7,049,173 B2

METHOD FOR FABRICATING SEMICONDUCTOR COMPONENT WITH CHIP ON BOARD LEADFRAME

CROSS REFERENCE TO RELATED APPLICATIONS

This application is a division of Ser. No. 10/633,434 filed Aug. 1, 2003, U.S. Pat. No. 6,903,449 B2.

FIELD OF THE INVENTION

This invention relates generally to semiconductor manufacture and packaging. More particularly, this invention relates to a semiconductor component having a chip on board leadframe, to a method for fabricating the component, and to systems incorporating the component.

BACKGROUND OF THE INVENTION

Semiconductor components, such as packages and BGA devices, are being manufactured with a chip scale outline, and with a higher pin count than conventional plastic or ceramic components. Semiconductor components typically include a substrate, a semiconductor die, and terminal contacts, such as balls, bumps or pins, arranged in an area array, such as a ball grid array (BGA), or a pin grid array (PGA). Semiconductor components can also include an encapsulant which at least partially encapsulates the die and the substrate.

Different methods are employed in the industry for fabricating semiconductor components. One conventional method uses a rigid substrate, such as a reinforced polymer laminate, attached to the die in a chip on board (COB) or a board on chip (BOC) configuration. The substrate includes conductors, such as copper traces, that are wire bonded to the bond pads on the die. The substrate can also include bonding sites in electrical communication with the conductors for mounting the terminal contacts in the required area array.

Another method for fabricating semiconductor components uses a metal leadframe that is attached and wire bonded to the die. The metal leadframe includes leadfingers which include bonding sites for wire bonding wire interconnects to the leadframe. The leadfingers are also typically bent or shaped to form the terminal contacts for the components.

One advantage of metal leadframes is that they are inexpensive to manufacture, and can be used with a variety of conventional packaging equipment, such as wire bonders, die attachers, conveyors and magazines. However, one problem with metal lead frames occurs when wire bonded wires short to bus bars physically and electrically connecting different leadfingers of the lead frames. This problem is compounded by the fine pitch of the wires for chip scale components, and the fine pitch of the wire bonds for the wires.

Another aspect of conventional metal leadframes is that the leadfingers are configured to form the terminal contacts as leads. However, it would be desirable for the leadframe to provide bonding sites for terminal contacts in the form of bumps, balls or pins in an area array, as is conventional for chip scale components.

The present invention is directed to a semiconductor component constructed with a metal leadframe designed to eliminate shorting between the wires and the bus bars on the leadframe. In addition, the metal leadframe is designed to provided bonding sites for attaching bumps, balls or pins in an area array, such as a ball grid array.

SUMMARY OF THE INVENTION

In accordance with the present invention, an improved semiconductor component, a method for fabricating the component, and electronic systems incorporating the component are provided.

The component includes a leadframe, a semiconductor die back bonded to the leadframe in a chip on board configuration, and wire interconnects bonded to the die and to the leadframe. The component also includes an array of terminal contacts attached to the leadframe, and an encapsulant encapsulating the die, the wire interconnects and the leadframe.

The leadframe includes leadfingers having interconnect bonding sites for the wire interconnects, and terminal bonding sites for the terminal contacts. In addition, the terminal bonding sites can be arranged in an area array such as a grid array, edge array or peripheral array. The leadframe also includes bus bars which physically and electrically connect selected leadfingers to one another. The bus bars are located proximate to inner portions of the leadfingers, and the interconnect bonding sites are located proximate to outer portions of the leadfingers, such that shorting between the bus bars and the wire interconnects is eliminated.

The fabrication method includes the steps of providing the leadframe, attaching the die to the leadframe, bonding the wire interconnects to the die and to the interconnect bonding sites, forming the encapsulant, and then forming the terminal contacts on the terminal bonding sites.

The component can be used to construct electronic systems such as modules, computers, camcorders, cameras and cell phones.

BRIEF DESCRIPTION OF THE DRAWINGS

FIG. 1A is an enlarged schematic plan view of a semiconductor component constructed in accordance with the invention;

FIG. 1B is an enlarged schematic side elevation view of the component;

FIG. 1C is an enlarged schematic cross sectional view of the component taken along line 1C—1C of FIG. 1A;

DETAILED DESCRIPTION OF THE PREFERRED EMBODIMENTS

Figure 1D:
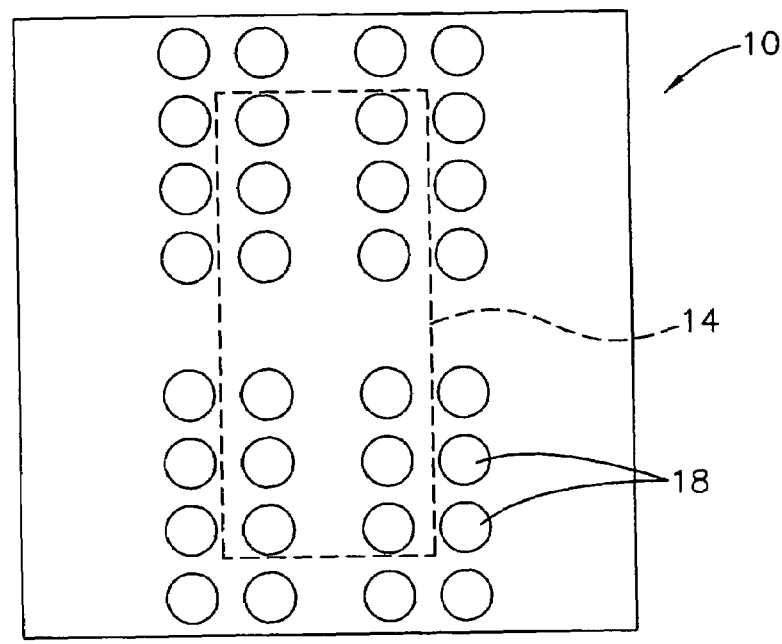
FIG. 1D is an enlarged schematic bottom view of the component taken along line 1D—1D of FIG. 1C.

Referring to FIGS. 1A–1F, a semiconductor component 10 constructed in accordance with the invention is illustrated. As used herein, the term "semiconductor component" refers to an electronic element that includes a semiconductor die. Exemplary semiconductor components include semiconductor packages, semiconductor dice and BGA devices. In the illustrative embodiment the component 10 comprises a chip scale semiconductor package.

The component 10 includes a leadframe 12, a semiconductor die 14 back bonded to the leadframe 12, and wire interconnects 16 wire bonded to the die 14 and to the leadframe 12. The component 10 also includes an array of terminal contacts 18 attached to the leadframe 12, and an encapsulant 20 encapsulating the die 14, the wire interconnects 16 and the leadframe 12.

The die 14 can comprise a conventional semiconductor die having active semiconductor devices constructed in a desired electrical configuration. For example, the die 14 can comprise a high speed digital logic device, such as a dynamic random access memory (DRAM), a static random access memory (SRAM), a flash memory, a microprocessor, a digital signal processor (DSP), or an application specific integrated circuit (ASIC). In addition, the die 14 can comprise a tested die that has been certified as a known good die.

In the illustrative embodiment, the die 14 is generally rectangular shaped with opposed lateral edges and opposed longitudinal edges. However, the die 14 can have any polygonal shape, such as square or triangular, and can also have a circular or oval shape. As shown in FIG. 1C, the die 14 is mounted to the leadframe 12 in a chip on board configuration. As used herein, the term "chip on board" means the die 14 has a back side 21 (FIG. 1C) bonded to the leadframe 12, and a circuit side 22 (FIG. 1C) having die contacts 24 (FIG. 1C) electrically interconnected to the leadframe 12 using a bonding process such as wire bonding.

Figure 1E:
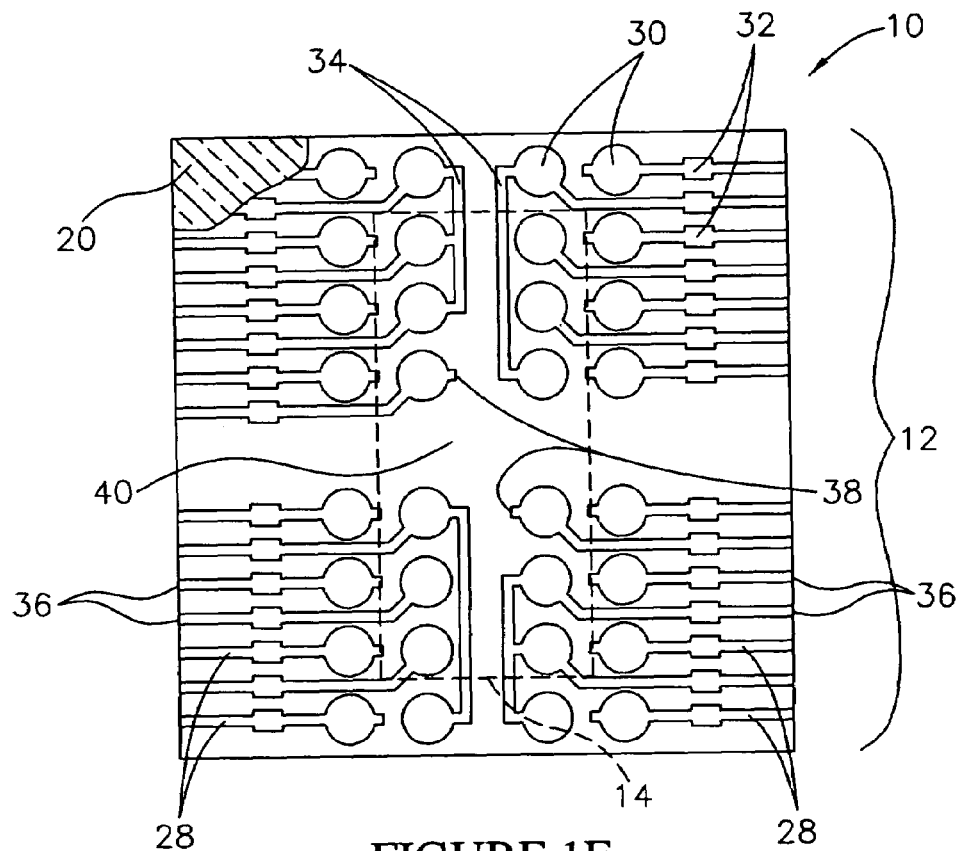
FIG. 1E is an enlarged schematic cross sectional view of the component taken along line 1E—1E of FIG. 1C.
Figure 1F:
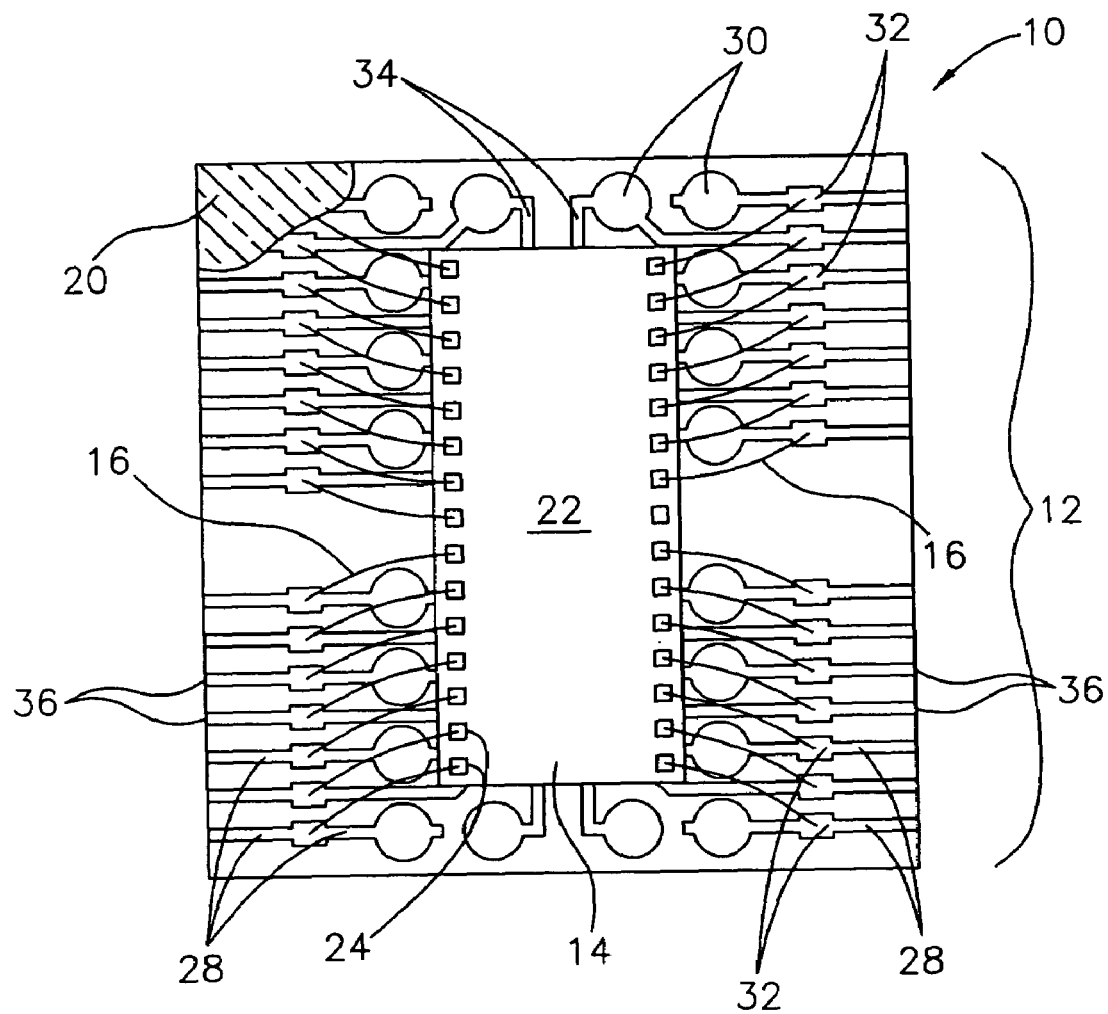
FIG. 1F is an enlarged schematic cross sectional view, partially cut away, of the component taken along line 1F—1F of FIG. 1C.

As shown in FIG. 1F, the die contacts 24 are square pads arranged in two rows proximate to the longitudinal edges of the die 14. However, this arrangement is merely exemplary, and the die contacts 24 can have any desired shape (e.g., round, rectangular) and any selected pattern (e.g., peripheral edge array, center array). In addition, the die contacts 24 can comprise the device bond pads, or alternately redistribution pads, in electrical communication with the integrated circuits contained on the die 14. Further, the die contacts 24 can comprise one or more layers of metal, and preferably include a wire bondable outer layer, such as Al, Au, Cu, or alloys of these metals.

The component 10 also includes adhesive members 26 configured to attach the back side 21 of the die 14 to the leadframe 12. The adhesive members 26 can comprise an electrically insulating tape material, such as a polyimide tape, having an adhesive material on one or both sides (e.g., "KAPTON" tape manufactured by DuPont). The adhesive members 26 can also comprise a curable die attach polymer, such as an epoxy, an acrylic, or a polyimide material. In the illustrative embodiment there are two spaced, generally rectangular shaped adhesive members 26 located proximate to longitudinal peripheral edges of the die 14. However, this arrangement is merely exemplary and other arrangements, such as one or more rows of adhesive dots can be employed.

The leadframe 12 is constructed to allow the die 14 to be mounted to the leadframe 12 in a chip on board configuration substantially as described above. This type of leadframe 12 is sometimes termed a chip on board leadframe. As shown in FIG. 1E, the leadframe 12 includes a pattern of leadfingers 28, which form an internal signal transmission system for the component 10. The leadfingers 28 also include inner tip portions arranged to provide a die mounting site 42 (FIG. 3A) for supporting for the die 14.

In the illustrative embodiment, the leadfingers 28 are arranged in parallel spaced rows, and there are two patterns of rows along opposing longitudinal edges of the leadframe 12. However, in actual practice the leadfingers 28 can be formed in an irregular electronic pattern, similar to metal traces on a printed circuit board. In addition, the leadfingers 28 can comprise a suitable metal such as an iron-nickel alloy or a copper alloy. Further, the leadfingers 28 can be fabricated using a conventional process such as stamping or etching, combined with plating if required.

As also shown in FIG. 1E, the leadframe 12 also includes a pattern of terminal bonding sites 30 on the leadfingers 28 for the terminal contacts 18, and a pattern of interconnect bonding sites 32 on the leadfingers 28 for the wire interconnects 16. The terminal bonding sites 30 and the interconnect bonding sites 32 are located on opposing surfaces of the leadfingers 28 substantially as shown in FIG. 1C. In this regard the interconnect bonding sites 32 are located on a first surface of the leadframe 12 and the terminal bonding sites 30 are located on an opposing second surface of the leadframe 12. In this case the first surface and the second surface are the major planar surfaces of the leadframe 12. The leadframe 12 also include bus bars 34, which physically and electrically connect selected leadfingers 28 to one another. Because the leadfingers 28 include the terminal bonding sites 30, and the interconnect bonding sites 32, the bus bars 34 electrically connect selected terminal bonding sites 30 and selected interconnect bonding sites 32 as well.

As shown in FIG. 1E, the terminal bonding sites 30 are arranged in a selected pattern, such as an area array. The pattern of the terminal bonding sites 30 determines the pattern of the terminal contacts 18. In the illustrative embodiment, there are thirty-two terminal bonding sites 30 and thirty-two terminal contacts 18 arranged in a grid array of four rows and eight columns. However, this arrangement is merely exemplary, and the terminal bonding sites 30 and the terminal contacts 18 can be arranged in any desired pattern or area array such as an edge array, a peripheral array or a center array. Also in the illustrative embodiment, the terminal bonding sites 30 are generally circular shaped pads formed integrally with the leadfingers 28 by stamping, etching, plating or other suitable method. However, the terminal bonding sites 30 can have any polygonal shape (e.g., square, rectangular). Further, the terminal bonding sites 30 can be formed separate from, but in electrical communication with the leadfingers 28.

Further, the terminal bonding sites 30 can comprise one or more layers of metal, such as an outer metal layer, such as Al, Au, Cu, or alloys of these metals, which facilitates bonding or forming of the terminal contacts 18 on the terminal bonding sites 30. A suitable process such as electrolytic deposition, electroless deposition, or CVD can be used to deposit an outer metal layer on the leadfingers 28 to form the terminal bonding sites 30 out of such a bondable metal.

As shown in FIG. 1E, the interconnect bonding sites 32 are located proximate to an outer periphery of the component 10 in a peripheral array, and are separated from the bus bars 34. Stated differently, the interconnect bonding sites 32 are located proximate to outer portions 36 of the leadfingers 28, and the bus bars 34 are located proximate to inner portions 38 of the leadfingers 28. In addition, the leadframe 12 includes a space 40 which separates the patterns of leadfingers 28 and the bus bars 34, on opposing sides of the component 10.

The location of the interconnect bonding sites 32 relative to the bus bars 34, permits the wire interconnects 16 to be wire bonded to the die 14 and the leadframe 12 without shorting to the bus bars 34. As shown in FIG. 1F, the die 14 substantially covers the bus bars 34, and the wire interconnects 16 extend from the die contacts 24 to the interconnect bonding sites 32 without crossing or touching the bus bars 34.

In the illustrative embodiment, the interconnect bonding sites 32 are generally rectangular shaped pads formed integrally with the leadfingers 28 by stamping, etching, plating or other suitable method. However, the interconnect bonding sites 32 can have any shape, and can be formed separate from, but in electrical communication with, the leadfingers 28. As with the terminal bonding sites 30, the interconnect bonding sites 32 can include an outer metal layer, such as Al, Au, Cu, or alloys of these metals, which facilitates wire bonding of the wire interconnects 16.

As shown in FIG. 1C, the terminal contacts 18 are formed on the terminal bonding sites 30. The terminal contacts 18 are also sometimes referred to in the art as outer lead bonds (OLB). In the illustrative embodiment, the terminal contacts 18 comprise metal bumps or balls. However, the terminal contacts 18 can also comprise pins, polymer bumps, spring contacts or any terminal contact or outer lead bond (OLB) known in the art. Also in the illustrative embodiment, there are thirty two terminal contacts 18, arranged in a ball grid array (BGA). However, this arrangement is merely exemplary, and the terminal contacts 18 can be arranged in any area array, such as a fine ball grid array (FBGA), an edge array or a peripheral array, containing any desired number of terminal contacts 18.

Further, in the illustrative embodiment, the terminal contacts 18 have outside diameters on the order of about 300 μm to 350 μm. This makes the terminal contacts 18 much larger in comparison to the other elements of the component 10. However, for illustrative purposes the terminal contacts 18 are shown as being about the same size as other elements of the component 10.

As shown in FIG. 1C, the encapsulant 20 substantially encapsulates the die 14 and the wire interconnects 16. In addition, the encapsulant 20 is formed on either side of the leadframe 12 and substantially encapsulates the leadfingers 28. The encapsulant 20 also partially encapsulates and electrically insulates the terminal contacts 18 from one another. The encapsulant 20 can comprise a curable polymer material such as an epoxy, a silicone, a polyimide or a transfer molded underfill compound (MUF). In addition, these polymer materials can include fillers, such as silicates, configured to reduce the coefficient of thermal expansion (CTE) and adjust the viscosity of the polymer material. The encapsulant 20 can alternately comprise a photo imageable material such as a resist, which can be patterned using a photolithography process, or a laser imageable material, which can be patterned using a stereographic lithography process.

Figure 2A:
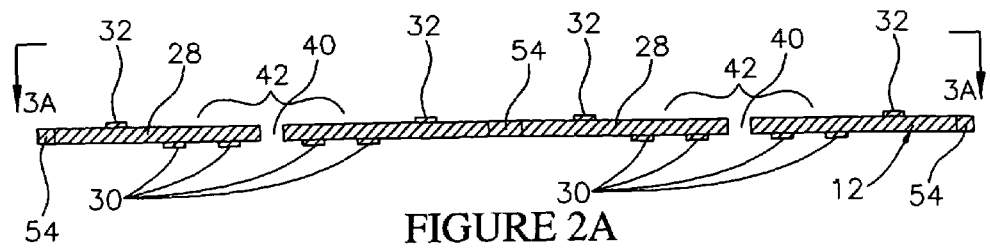
FIGS. 2A–2E are enlarged schematic cross sectional views illustrating steps in a method for fabricating the component of FIGS. 1A–1F.
Figure 2B:
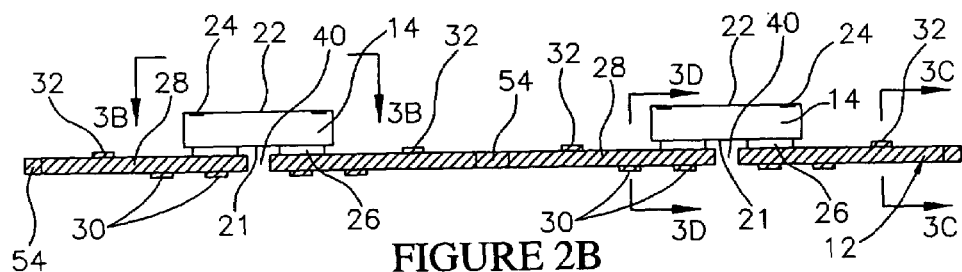
Figure 2C:
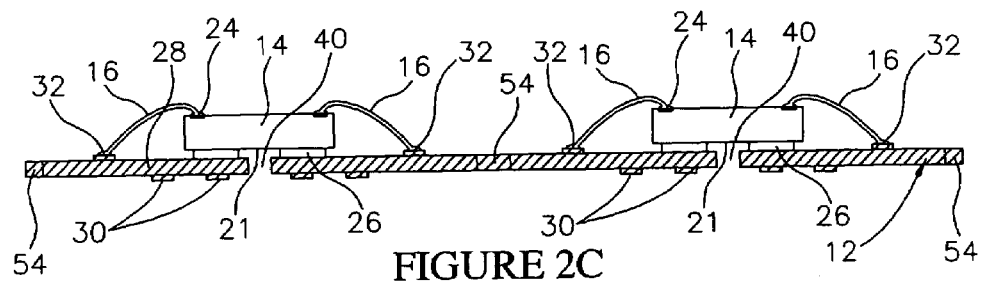
Figure 2D:
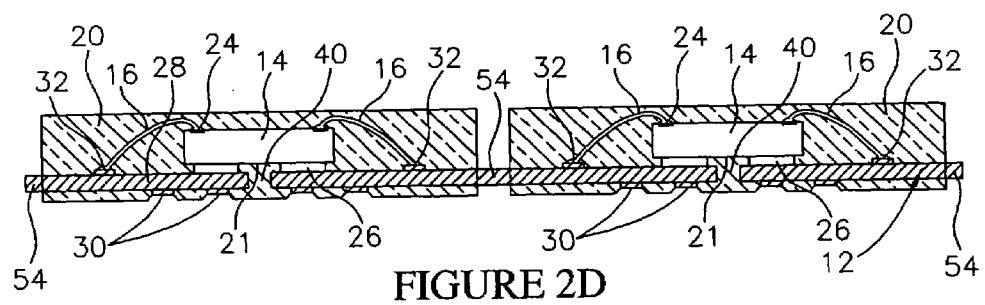

Referring to FIGS. 2A–2E, steps in a method for fabricating the component 10 are illustrated. Initially, as shown in FIG. 2A, the leadframe 12 can be provided. As shown in FIG. 3A, the leadframe 12 can be initially contained on a leadframe strip 44 containing a plurality of leadframes 12. For illustrative purposes, the leadframe strip 44 is illustrated as containing two leadframes 12 for fabricating two components 10 at the same time. However, in actual practice the leadframe strip 44 can include any desired number of leadframes (e.g., 2–12).

Figure 2E:
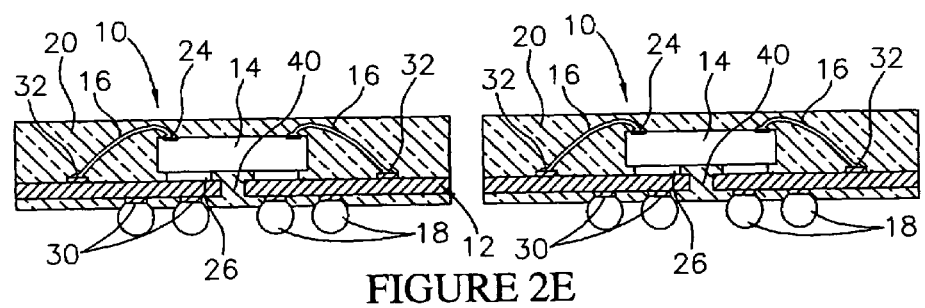
Figure 3A:
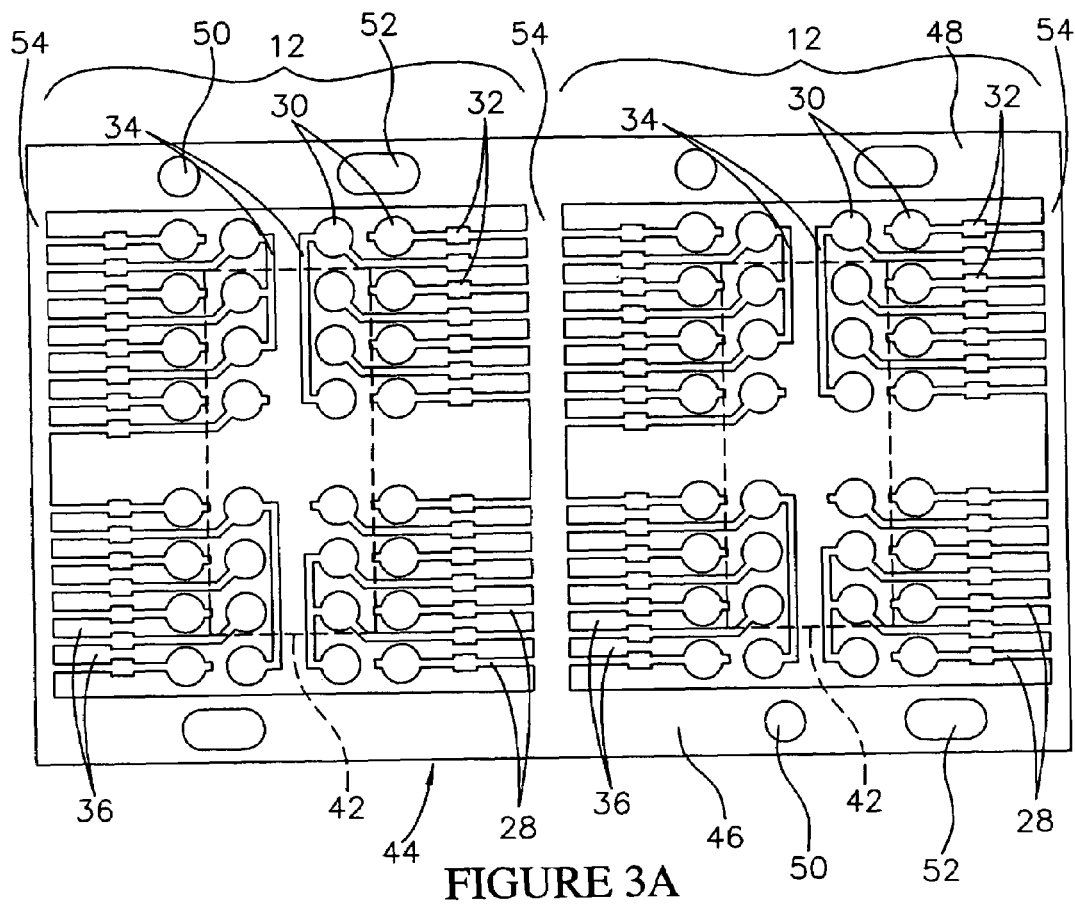
FIG. 3A is an enlarged schematic plan view of a leadframe strip used in the fabrication method taken along line 3A—3A of FIG. 2A.

As also shown in FIG. 3A, the leadframe strip 44 includes parallel spaced side rails 46, 48, which will subsequently be trimmed from the completed components 10 (FIG. 2E). The side rails 46, 48 include openings 50, 52 which allow the leadframe strip 44 to be handled and indexed by automated leadframe handling machinery, such as tracks, conveyors, and magazines. The leadframe strip 44 also includes connecting segments 54 which separate adjacent leadframes 12, and physically connect the leadfingers 28 on the leadframes 12 to the side rails 46, 48 on the leadframe strip 44. The connecting segments 54 are similar in construction to the bus bars 34, but unlike the bus bars 34, will subsequently be trimmed from the completed components 10 (FIG. 2E).

As shown in FIG. 2A, each leadframe 12 on the leadframe strip 44 includes opposing patterns of leadfingers 28 separated by the spaces 40. In addition, the leadfingers 28 include the interconnect bonding sites 32, and the terminal bonding sites 30 on opposing sides of the leadfingers 28, substantially as previously described. Further, the leadfingers 28 on each leadframe 12 include the die mounting sites 42 for back bonding the die 14 to the leadframe 12 in a chip on board configuration. Still further, the terminal bonding sites 30 are arranged in an area array, such as a grid array, which also determines the pattern of the terminal contacts 18.

Figure 3B:
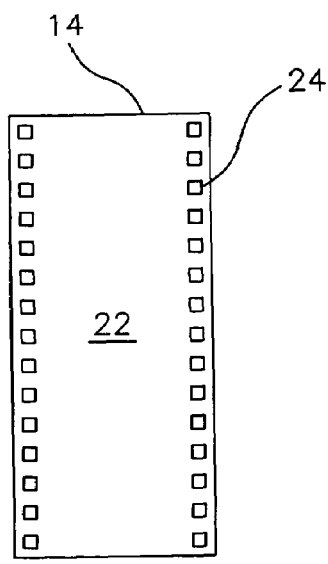
FIG. 3B is an enlarged schematic plan view of a semiconductor die used in the fabrication method taken along line 3B—3B of FIG. 2B.

Next, as shown in FIG. 2B, the semiconductor dice 14 are provided. In addition, a die attach step is performed in which the dice 14 are attached to the leadframe 12. As shown in FIG. 3B, each die 14 includes a circuit side 22 wherein the die contacts 24 are located. The die contacts 24 can comprise bond pads or redistribution pads in electrical with the integrated circuits contained on the die 14. In the illustrative embodiment, the die contacts 24 are generally square shaped pads formed along opposing peripheral edges on the circuit side 22 of the die 14. However, this arrangement is merely exemplary and other shapes and patterns for the die contacts 24 can be employed to construct the component 10.

As also shown in FIG. 2B, the dice 14 are attached to the leadframe 12 in a chip on board configuration. The die attach step can be performed by placing the adhesive members 26 on the back sides of the dice 14, and then placing the dice 14 on the die mounting sites 42 (FIG. 3A) on leadframe 12. Alternately, the adhesive members 26 can be placed on the die mounting sites 42, and then the dice 14 placed on the adhesive members 26. The die attach step can be performed using a conventional die attach apparatus configured to apply the adhesive members 26 to the dice 14 (or to the leadframe 12), and then to press the dice 14 against the leadframe 12. The adhesive members 26 can comprise a curable polymer material as previously described, or strips of polymer tape covered with an adhesive material, also as previously described.

Figure 3C:
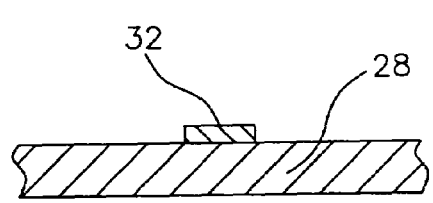
FIG. 3C is an enlarged schematic cross sectional view of an interconnect bonding site on the leadframe taken along line 3C—3C of FIG. 2B.

Next, as shown in FIG. 2C, a bonding step is performed in which the wire interconnects 16 are bonded to the die contacts 24 on the dice 14, and to the interconnect bonding sites 32 on the leadframe 12. In the illustrative embodiment, the wire interconnects 16 comprise metal wires formed of a material such as Au, Al, or alloys thereof, such as AlMG or AuSi. With the wire interconnects 16 comprising metal wires, the bonding step can be performed using a conventional wire bonder apparatus configured to wire bond the wire interconnects 16 to the die contacts 24 and to the interconnect bonding sites 32. As shown in FIG. 3C, the interconnect bonding sites 32 can comprise pads which include one or more metal layers including a bondable outer layer, such as Al, Cu, Au or alloys thereof, configured to facilitate the wire bonding process. In addition, the interconnect bonding sites 32 are formed on the first side of the leadframe 12, which is also the side to which the die 14 is attached.

Rather than wire interconnects 16 formed by wire bonding, tape automated bonding (TAB) interconnects can be used, and TAB bonding techniques such as thermode bonding, can be employed to bond the TAB interconnects to the die contacts 24 and to the interconnect bonding sites 32. In this case, the TAB interconnects can be contained on a multilayered tape, such as TAB tape, or "ASMAT" manufactured by Nitto Denko of Japan.

As shown in FIG. 3A, the wire bonding step is also facilitated by the location of the interconnect bonding sites 32 on the leadframes 12 relative to the location of the bus bars 34 on the leadframes 12. In this regard, the interconnect bonding sites 32 are located proximate to the outer peripheries and opposing outer edges of the leadframes 12. On the other hand, the bus bars 34 are located proximate to the inner portions of the leadframes 12 and near the spaces 40 which separate the opposing patterns of leadfingers 28. With the present arrangement, the bonded wire interconnects 16 do not cross the bus bars 34, such that shorting between the wire interconnects 16 and the bus bars 34 cannot occur. Stated differently, the leadframes 12 are configured to allow wire bonding of the wire interconnects 16 to occur without shorting to the bus bars 34. In addition, in the completed component 10, the wire interconnects 16 do not cross the bus bars 34, such that shorting from the wire interconnects 16 to the bus bars 34 again cannot occur.

Next, as shown in FIG. 2D, an encapsulating step is performed in which the encapsulants 20 are formed on the leadframe strip 44. The encapsulants 20 function to protect the wire interconnects 16 and associated wire bonds, and to seal the dice 14 on the leadframes 12. As such, the encapsulants 20 cover and encapsulate the wire interconnects 16 and the dice 14. In addition, the encapsulants seal and substantially cover both major surfaces of the leadframes 12, but do not cover the terminal bonding sites 30 on the leadframes 12. The encapsulants 20 also form the outer bodies and make up the bulk of the components 10. Further, each encapsulant 20 has a generally square shape when view from above, and a thickness that is only slightly greater than the thickness of the die 14 and the leadframe 12 combined. Still further, each encapsulant 20 has a peripheral outline matching that of the leadframe 12, and this outline determines the peripheral outline or footprint of the component 10. The peripheral outline of each encapsulant 16 can be slightly larger than that of the die 14 (e.g., 1.25×), such that the component 10 can be considered a chip scale component.

The encapsulants 20 can comprise a polymer material such as an epoxy, a silicone, a polyimide or a transfer molded underfill compound (MUF). In addition, these polymer materials can include fillers such as silicates configured to reduce the coefficient of thermal expansion (CTE) and adjust the viscosity of the polymer material. One method for forming the encapsulants 20 is by deposition in a viscous state in the manner of a "glob top", using a conventional deposition apparatus, such as a material dispensing system having a computer controlled nozzle. One suitable system is manufactured by Asymtek of Carlsbad, Calif. Following deposition, the encapsulants 20 can be cured, and if required shaped or planarized using a grinder or other suitable apparatus. As shown in FIG. 1A, each encapsulant 20 has orthogonal, generally planar surfaces. The encapsulants 20 can also be transfer molded using a transfer molding apparatus.

Figure 3D:
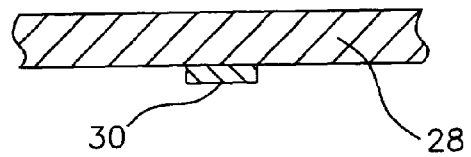
FIG. 3D is an enlarged schematic cross sectional view of a terminal bonding site on the leadframe taken along line 3D—3D of FIG. 2B.

Next, as shown in FIG. 2E, a terminal contact forming step is performed in which the terminal contacts 18 are formed on the terminal bonding sites 30 on the leadframes 12. As shown in FIG. 3D, the terminal bonding sites 30 can comprise pads formed of a bondable metal such as Al, Cu, Au or alloys thereof, to facilitate forming or bonding of the terminal contacts 18. In addition, the terminal bonding sites 30 are formed on the second opposing side of the leadframe 12, which is opposite to the first side to which the die 14 is attached.

The terminal contact forming step can be performed by bonding, or depositing, the terminal contacts 18 on the terminal bonding sites 30. For example, the terminal contacts 18 can comprise metal bumps deposited using a suitable deposition process, such as stenciling and reflow of a solder alloy. The terminal contacts 18 can also be formed by electrolytic deposition, by electroless deposition, or by bonding pre-fabricated balls to the terminal bonding sites 30. Also, rather than being formed of metal, the terminal contacts 18 can comprise a conductive polymer material. Still further, the terminal contacts 18 can comprise metal, or metal plated pins.

As also shown in FIG. 2E, a singulating step is performed in which the leadframe strip 44 (FIG. 3A) is trimmed to remove the siderails 46, 48 (FIG. 3A) and the connecting segments 54 (FIG. 3A). In addition, the singulating step separates the individual components 10 from the leadframe strip 44, such that each component 10 is a discrete element. The singulating step can be performed using a suitable apparatus such as a saw or a shear.

Figure 4A:
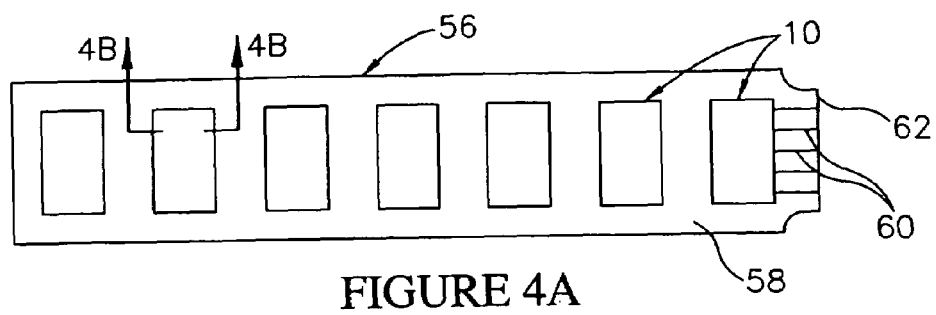
FIG. 4A is a schematic plan view of a module system incorporating one or more components constructed in accordance with the invention.
Figure 4B:
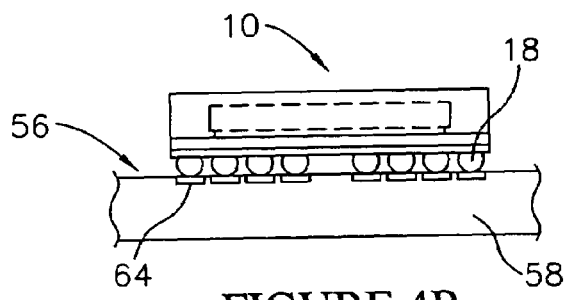
FIG. 4B is a schematic cross sectional view of the module system taken along line 4B—4B of FIG. 4A.

Referring to FIGS. 4A and 4B, a multi chip module system 56 that includes multiple components 10 is illustrated. The multi chip module system 56 can be configured for performing a specific function such as memory storage. The multi chip module system 56 includes a module substrate 58 having patterns of electrodes 64 (FIG. 4B) configured for flip chip mounting the components 10 to the module substrate 58. The terminal contacts 18 on the components 10 can be bonded to the electrodes 64 on the module substrate 58 using a suitable bonding process, such as solder reflow, thermode bonding or conductive polymer bonding. The electrodes 64 are in electrical communication with conductors 60 formed on the module substrate 58 in a required circuit pattern. In addition, the conductors 60 are in electrical communication with an edge connector 62 which provides connection points from the outside to the multi chip module system 56.

Figure 5:
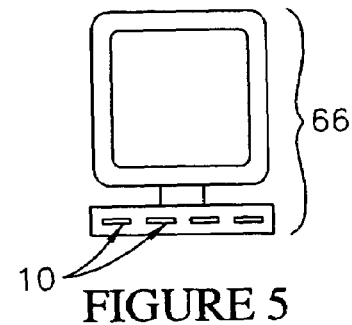
FIG. 5 is a schematic cross sectional view of a computer system incorporating one or more components constructed in accordance with the invention.

Referring to FIG. 5, a computer system 66 includes one or more components 10, which can be mounted to the computer system 66 in a suitable manner. In addition, the components 10 can be configured to perform a desired function in the computer system 66 such as memory, storage or micro processing.

Figure 6:
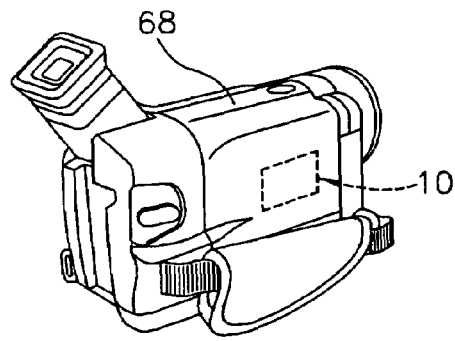
FIG. 6 is a schematic cross sectional view of a camcorder system incorporating one or more components constructed in accordance with the invention.

Referring to FIG. 6, a digital camcorder system 68 includes one or more components 10, which can be mounted in a suitable manner, and configured to perform a desired circuit function in the camcorder system 68.

Figure 7:
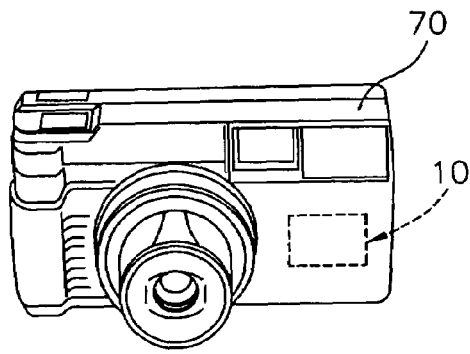
FIG. 7 is a schematic cross sectional view of a camera system incorporating one or more components constructed in accordance with the invention.

Referring to FIG. 7, a camera system 70 includes one or more components 10, which can be mounted in a suitable manner, and configured to perform a desired circuit function in the camera system 70.

Figure 8:
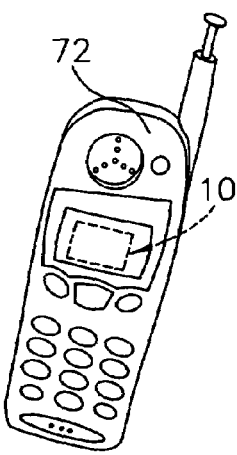
FIG. 8 is a schematic cross sectional view of a cellular phone system incorporating one or more components constructed in accordance with the invention.

Referring to FIG. 8, a cellular phone system 72 includes one or more components 10, which can be mounted to in a suitable manner, and configured to perform a desired circuit function in the cellular phone system 72.

Thus the invention provides an improved chip scale semiconductor component, a method for fabricating the component, and a system incorporating the component. While the invention has been described with reference to certain preferred embodiments, as will be apparent to those skilled in the art, certain changes and modifications can be made without departing from the scope of the invention as defined by the following claims.

What is claimed is:

1. A method for fabricating a semiconductor component comprising:
providing a metal leadframe comprising a plurality of leadfingers having first bonding sites on a first side and second bonding sites on a second side, and a bus bar connecting at least some of the second bonding sites;
attaching a semiconductor die to the first side at least partially covering the bus bar;
bonding a plurality of interconnects to the die and to the first bonding sites with the die preventing the interconnects from shorting to the bus bar; and
forming a plurality of terminal contacts on the second bonding sites.

2. The method of claim 1 further comprising forming an encapsulant on the die, on the interconnects and on the leadframe.

3. The method of claim 1 wherein the interconnects comprise wires and the bonding step comprises wire bonding.

4. A method for fabricating a semiconductor component comprising:
providing a leadframe comprising a plurality of leadfingers, a plurality of interconnect bonding sites on a first side thereof, a plurality of terminal bonding sites on a second side thereof in an area array, and a bus bar in the area array connecting selected terminal bonding sites;
attaching a back of a semiconductor die to the leadfingers on the first side substantially covering the bus bar;
bonding a plurality of interconnects to the die and to the interconnect bonding sites with the die preventing shorting to the bus bar;
forming a plurality of terminal contacts on the terminal bonding sites; and
forming an encapsulant on the die, on the interconnects and on the leadframe.

5. The method of claim 4 wherein the attaching step comprises forming an adhesive member between the die and the leadframe.

6. The method of claim 4 wherein the forming the terminal contacts step comprises forming or attaching bumps or balls to the terminal bonding sites.

7. The method of claim 4 wherein the interconnects comprise wires and the bonding step comprises wire bonding.

8. The method of claim 4 wherein the leadframe is contained on a strip containing a plurality of leadframes.

9. A method for fabricating a semiconductor component comprising:
providing a leadframe comprising a plurality of leadfingers, a plurality of interconnect bonding sites on the leadfingers, a plurality of terminal bonding sites on the leadfingers, at least one bus bar electrically connecting selected leadfingers and a die mounting site formed by the leadfingers and the terminal bonding sites;
providing a semiconductor die comprising a circuit side, a plurality of die contacts on the circuit side, and a back side;
attaching the back side of the die to the die mounting site with the die at least partially covering the bus bar;
bonding a plurality of interconnects to the die contacts and to the interconnect bonding sites with the die preventing shorting between the bus bar and the interconnects;
forming a plurality of terminal contacts on the terminal bonding sites; and
forming an encapsulant on the die and the leadframe.

10. The method of claim 9 wherein the interconnect bonding sites are located proximate to an outer periphery of the leadframe and the bus bar is located proximate to an inner portion of the leadframe.

11. The method of claim 9 wherein the interconnects comprise wires.

12. The method of claim 9 wherein the terminal contacts comprise metal bumps or balls and the terminal bonding sites are arranged in a grid array.

13. The method of claim 9 wherein the leadframe comprises a chip on board leadframe.

14. The method of claim 9 wherein the forming the encapsulant step comprises transfer molding a polymer on the die and the leadframe.

15. A method for fabricating a semiconductor component comprising:
providing a leadframe having a first side, an opposing second side, a plurality of leadfingers, a plurality of interconnect bonding sites on the leadfingers on the first side, a plurality of terminal bonding sites on the leadfingers on the opposing second side in an area array, and at least one bus bar in the area array electrically connecting selected leadfingers;
attaching a semiconductor die to the leadfingers on the first side at least partially covering the bus bar;
bonding a plurality of interconnects to the die and to the interconnect bonding sites with the die preventing shorting between the bus bar and the interconnects; and
forming a plurality of terminal contacts on the terminal bonding sites.

16. The method of claim 15 further comprising forming an encapsulant on the leadframe and the die.

17. The method of claim 15 wherein the interconnects comprise wires and the bonding step comprises wire bonding.

18. The method of claim 15 wherein the attaching step comprises forming an adhesive member between the die and the leadframe.

19. The method of claim 15 wherein the forming the terminal contacts step comprises forming or attaching bumps or balls to the terminal bonding sites.

20. The method of claim 15 wherein the leadframe is contained on a strip containing a plurality of leadframes.

21. A method for fabricating a semiconductor component comprising:
providing a leadframe having a first side and an opposing second side, the leadframe comprising a plurality of leadfingers having a die mounting site on the first side, a plurality of interconnect bonding sites on the first side, a plurality of terminal bonding sites on the second side in an area array and a plurality of bus bars electrically connecting selected leadfingers;
back bonding a semiconductor die to the die mounting site, the die at least partially covering the bus bars;
bonding a plurality of interconnects to the die and to the interconnect bonding sites with the die preventing shorting between the interconnects and the bus bars;
forming a plurality of terminal contacts on the terminal bonding sites; and
encapsulating the die, the leadframe, and the interconnects in an encapsulant.

22. The method of claim 21 wherein the interconnect bonding sites are located proximate to an outer periphery of the leadframe and the bus bars are located proximate to an inner portion of the leadframe.

23. The method of claim 21 wherein the interconnects comprise wires.

24. The method of claim 21 wherein the leadframe has a chip on board configuration.

25. The method of claim 21 wherein the encapsulant has a chip scale outline.

26. The method of claim 21 wherein the leadframe has a chip scale outline.

27. The method of claim 21 wherein the forming the terminal contacts step comprises depositing or bonding bumps or balls to the terminal bonding sites.

* * * * *